(12) United States Patent
Ochi

(10) Patent No.: US 6,759,692 B1
(45) Date of Patent: Jul. 6, 2004

(54) GATE DRIVER WITH LEVEL SHIFT CIRCUIT

(75) Inventor: Sam Seiichiro Ochi, Saratoga, CA (US)

(73) Assignee: IXYS Corporation, Santa Clara, CA (US)

(*) Notice: Subject to any disclaimer, the term of this patent is extended or adjusted under 35 U.S.C. 154(b) by 60 days.

(21) Appl. No.: 10/349,804

(22) Filed: Jan. 22, 2003

Related U.S. Application Data

(60) Provisional application No. 60/354,701, filed on Feb. 4, 2002.

(51) Int. Cl.[7] .............................................. H01L 29/74
(52) U.S. Cl. ....................... 257/107; 257/119; 257/155; 257/175; 327/333; 327/112
(58) Field of Search ................................ 257/107, 119, 257/124, 130, 146, 155, 157, 175; 327/333, 112, 108; 363/98, 97, 17, 56

(56) References Cited

U.S. PATENT DOCUMENTS

| | | | |
|---|---|---|---|
| 5,171,699 A | | 12/1992 | Hutter et al. |
| 5,502,412 A | * | 3/1996 | Choi et al. .................. 327/333 |
| 5,514,981 A | | 5/1996 | Tam et al. |
| 5,548,133 A | * | 8/1996 | Kinzer ........................ 257/155 |
| 5,659,452 A | * | 8/1997 | Blackburn .................... 361/31 |
| 5,666,280 A | * | 9/1997 | Janaswamy et al. .......... 363/98 |
| 5,747,943 A | * | 5/1998 | Houk et al. .................. 315/225 |
| 5,883,910 A | | 3/1999 | Link |
| 6,021,058 A | | 2/2000 | Yasohara et al. |
| 6,380,004 B2 | | 4/2002 | Boden, Jr. et al. |

FOREIGN PATENT DOCUMENTS

JP 07142940 A * 6/1995

* cited by examiner

*Primary Examiner*—Nathan J. Flynn
*Assistant Examiner*—Remmon R. Forde
(74) *Attorney, Agent, or Firm*—Townsend and Townsend and Crew LLP

(57) ABSTRACT

A gate driver includes a gate control signal generator having a first input and configured to output a gate control signal to a power semiconductor switch and a first sub-circuit having a first signal path and a second signal path that are suitable for transmitting signals. The first and second signal paths are coupled to the first input of the gate control signal generator. The second signal path is configured to provide a signal to the first input with a reduced signal delay.

20 Claims, 6 Drawing Sheets

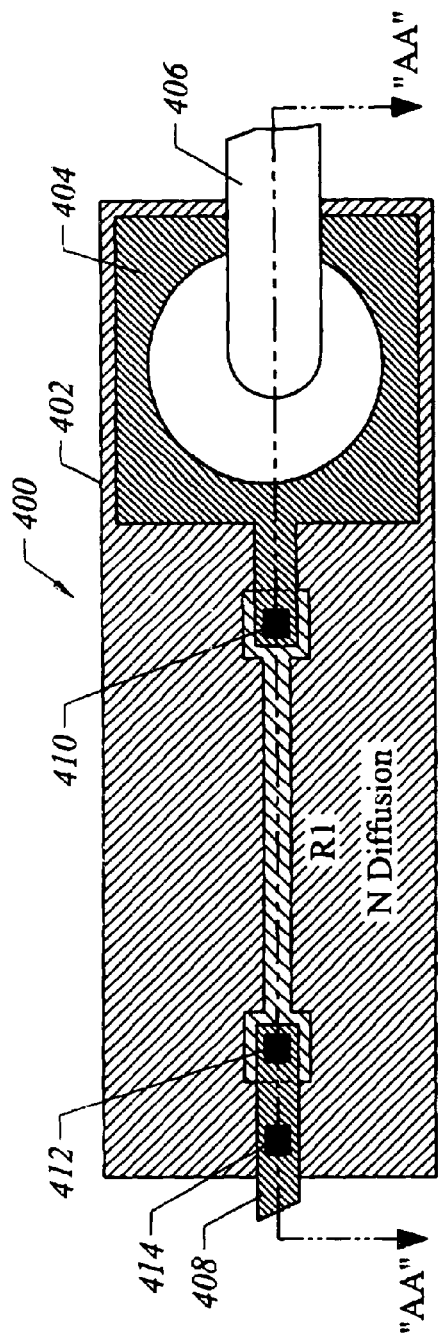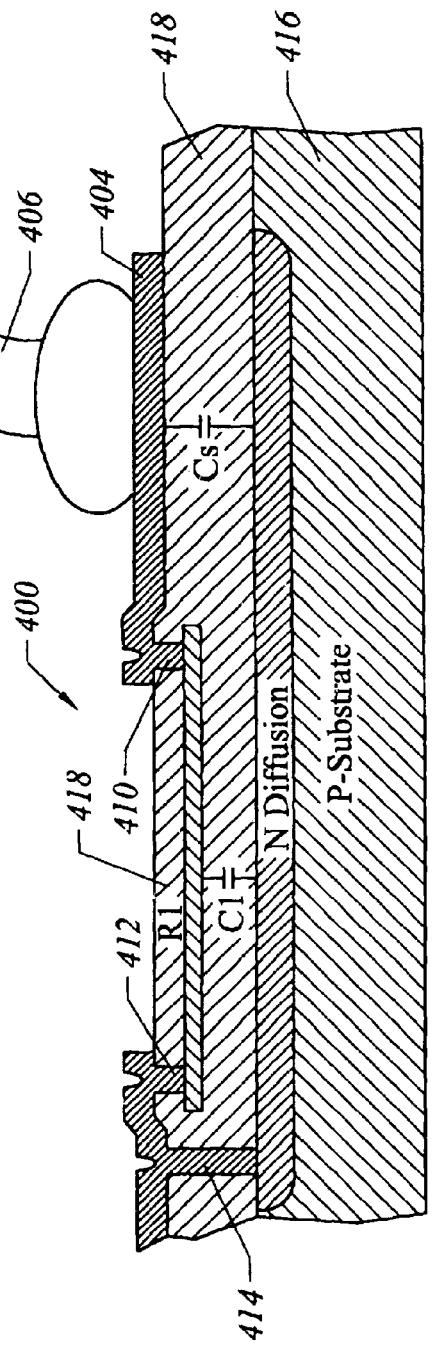
FIG. 4A
FIG. 4B

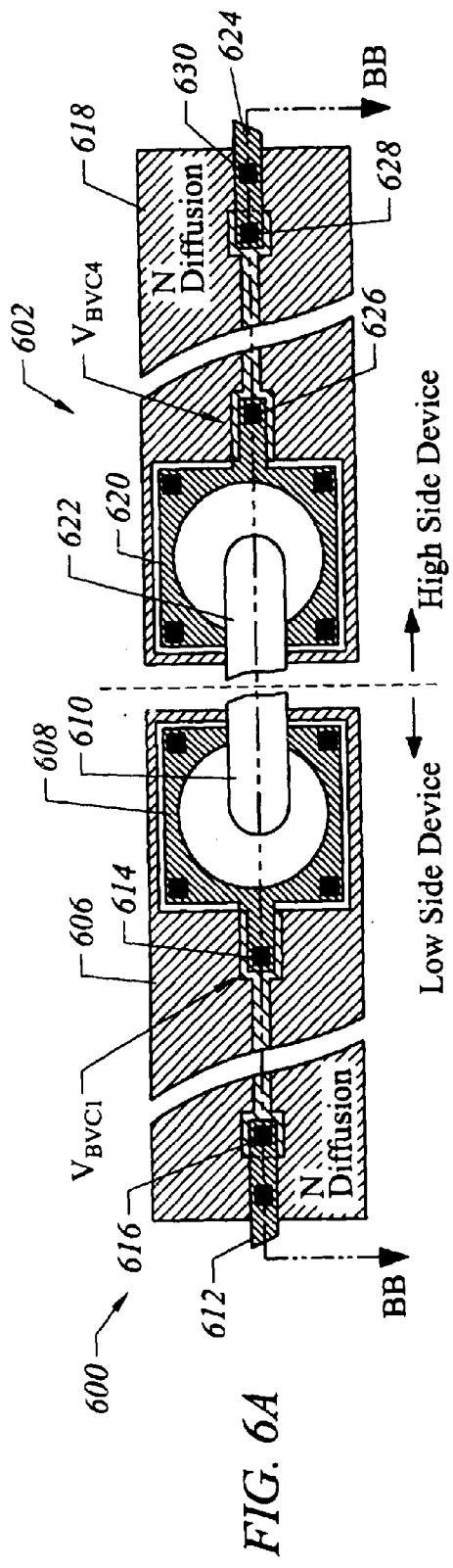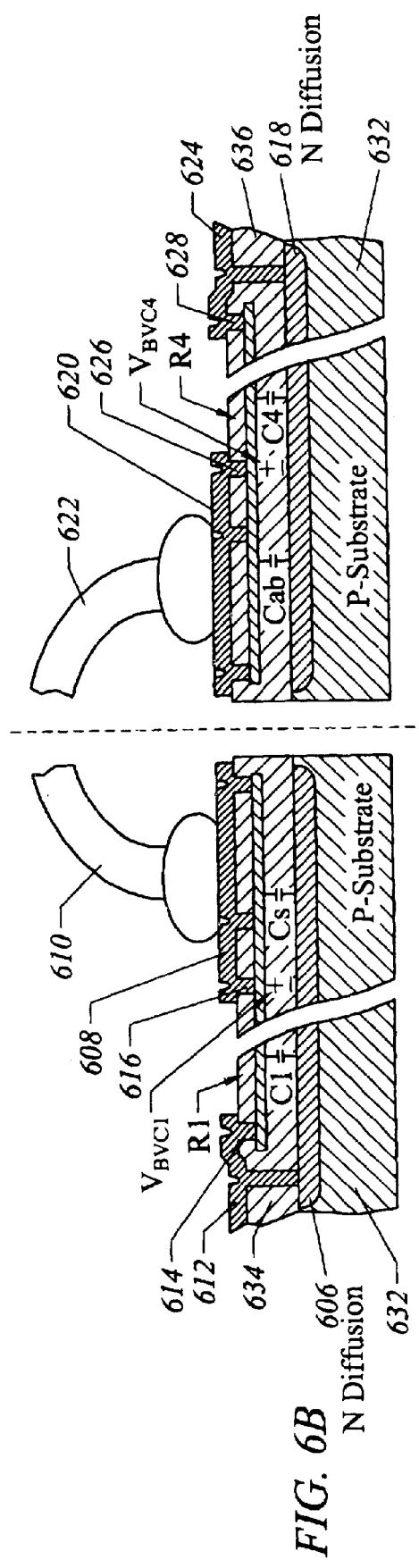
FIG. 6A
FIG. 6B

//10" }}

GATE DRIVER WITH LEVEL SHIFT CIRCUIT

CROSS-REFERENCES TO RELATED APPLICATIONS

This application claims priority to U.S. Provisional Patent Application No. 60/354,701, filed on Feb. 4, 2002, which is incorporated by reference herein for all purposes.

BACKGROUND OF THE INVENTION

The present invention relates to a gate driver having level shift circuit for driving the gate of a power semiconductor device.

Many low voltage electronic circuits, e.g., MOSFET devices, are used to drive high voltage switching transistors, e.g., power MOSFETs, insulated gate bipolar transistor devices (IGBTs), gate controlled thyristors, and the like. A power semiconductor switch or device is switched from a nonconducting state to a conducting state by raising the gate-source voltage from below to above a threshold voltage. As used herein, the term "power device" or "power semiconductor device" refers to any power MOSFET, IGBT, thyristor, or the like.

One or more low voltage transistors, coupled to an output node of the gate driver, apply appropriate voltages to the gate or control terminal of the power device to turn on or turn off the power device. When the power device is an N-channel metal oxide semiconductor field effect transistor (NMOSFET), the device is turned on by applying a high voltage to the gate of the power switch and turned off by applying a low voltage to the gate. In contrast, if the power device is a P-channel metal oxide semiconductor field effect transistor (PMOSFET), the device is turned on by applying a low voltage to the gate of the power switch and turned off by applying a high voltage to the gate. Unless otherwise explained, power devices, as used herein, refer to in N type devices for ease of illustration.

Generally, a gate driver includes a level shifting circuit for shifting the potential of a small control signal to a higher voltage level that is more suitable for turning on the power device. The gate driver may be packaged as a single device having a high side portion and a low side portion, where the high side is used to turn on or off a high side switch or transistor of the power device and the low side is used to turn on or off a low side switch or transistor of the power device. The high side switch has a drain coupled to a high voltage source, e.g., 1000 volts, while the low side switch has a drain coupled to a lower voltage source, e.g., a source of the high side switch.

BRIEF SUMMARY OF THE INVENTION

In one embodiment, a power module includes a power semiconductor device having a first terminal, a second terminal, and a third terminal. The second terminal is a control terminal to regulate flow of electricity between the first and third terminals. A gate driver has an output node coupled to the second terminal of the power device to provide gate control signals to the power semiconductor device. The gate driver includes a gate control signal generator having a first input and a second input and a first sub-circuit having a first signal path and a second signal path that are suitable for transmitting signals. The first and second signal paths are coupled to the first input of the gate control signal generator. The second signal path is configured to provide a signal to the first input with a reduced signal delay.

The gate driver further includes a second sub-circuit coupled to the second input of the gate control signal generator.

In another embodiment, a gate driver includes a gate control signal generator having a first input and configured to output a gate control signal to a power semiconductor switch and a first sub-circuit having a first signal path and a second signal path that are suitable for transmitting signals. The first and second signal paths are coupled to the first input of the gate control signal generator. The second signal path is configured to provide a signal to the first input with a reduced signal delay.

In yet another embodiment, a power device includes a gate control signal generator having a first input and configured to output a gate control signal to a power semiconductor switch. A first sub-circuit has a first signal path and a second signal path that are suitable for transmitting signals. The first and second signal paths are coupled to the first input of the gate control signal generator. The second signal path is configured to provide a signal to the first input with a reduced signal delay. A second sub-circuit includes a third signal path and a fourth signal path that are suitable for transmitting signals. The third and fourth signal paths are coupled to the second input of the gate control signal generator. The first input of the gate control signal generator receives a signal of first voltage from the first sub-circuit and the second input of the gate control signal generator receives a signal of second voltage from the second sub-circuit. The gate control signal generator outputs a gate control signal according to a voltage difference between the signal of first voltage and the signal of second voltage. The second signal path and fourth signal path are feed forward connections.

BRIEF DESCRIPTION OF THE DRAWINGS

FIG. 4A illustrates a schematic, partially delayered top structural view of a sub-circuit of the level shift circuit according to one embodiment of the present invention.

FIG. 4B illustrates a cross-sectional view of the structure of FIG. 4A taken along the arrows AA according to one embodiment of the present invention.

FIG. 6A illustrates a schematic, partially delayered top structural view of the two sub-circuits of the level shift circuit of FIG. 5 according to one embodiment of the present invention.

FIG. 6B illustrates a cross-sectional view of the structure of FIG. 6A taken along the arrows BB according to one embodiment of the present invention.

DETAILED DESCRIPTION OF THE INVENTION

Figure 1:
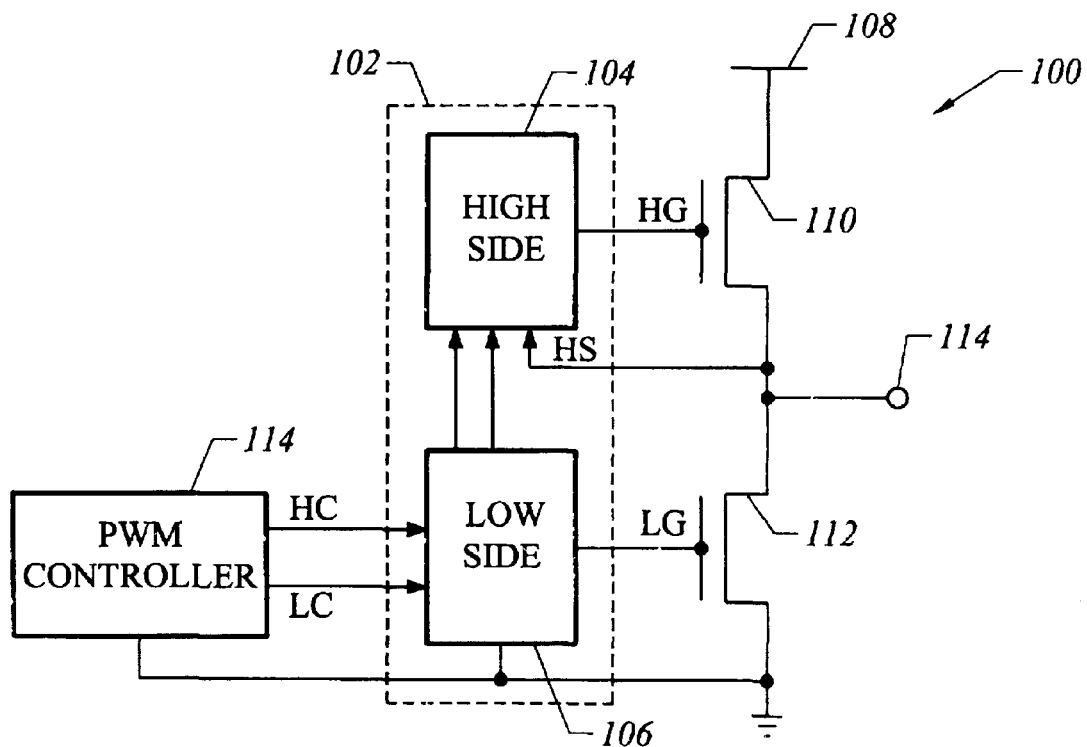
FIG. 1 illustrates a schematic diagram of a power module according to one embodiment of the present invention.

FIG. 1 schematically illustrates a power module 100 according to one embodiment of the present invention. The power module includes a first power device or gate driver 102 having a high side driver 104 and a low side driver 106, a second power device or switch 108 having a high side transistor 110 and a low side transistor 112, and a signal provider or pulse width modulation (PWM) controller 114.

The second power device 108 has a half bridge configuration. The drain is coupled to a high voltage source, e.g., 1,000 volts, and its source is coupled to the drain of the low side transistor. The source of the low side transistor, in turn, is grounded. In another embodiment, the drain and source of the high side transistor are coupled to a positive voltage source, e.g., 500 volts, and a negative voltage source, e.g., −500 volts.

The power device 108 includes an output node 114 coupled to a node between the source of the high side transistor 110 and the drain of the low side transistor 112. The output node is coupled to and provides an output voltage signal to drive an external load. As shown, the high side driver 104 and the low side driver 106 provide a high-side gate control signal HG and a low-side gate control signal LG to the gate electrode of the high side transistor 110 and the gate electrode of the low side transistor 112, respectively. A feed back signal HS from the source of the high side transistor 110 is provided to the high side driver 104 for use by the high side driver in generating the high-side control signal HG.

Figure 2:
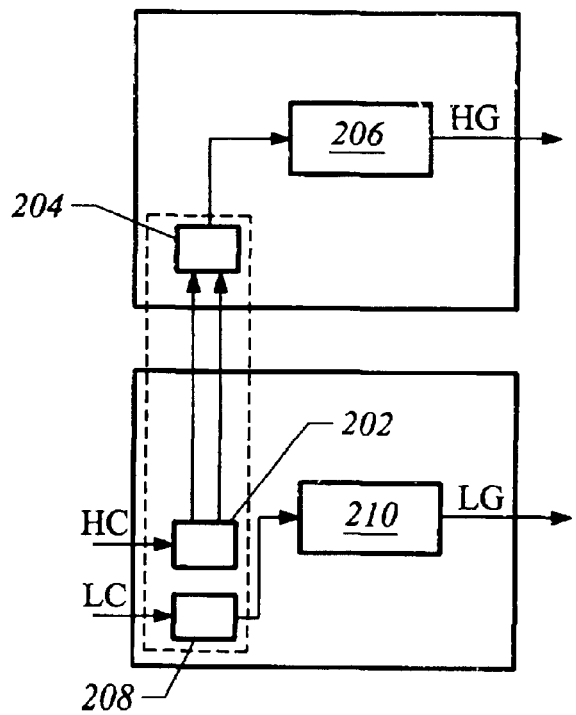
FIG. 2 illustrates a schematic diagram of a gate driver according to one embodiment of the present invention.

Referring to FIGS. 1 and 2, the PWM controller 114 provides a high-side signal HC and a low-side signal LC that are used by the high side driver and the low side driver, respectively, to generate the high-side gate control signal HG and the low-side gate control signal LG. A transceiver 202 in the low side driver receives the high-side signal HC and transmits appropriate one or more signals to a high side receiver 204 provided in the high side driver. The high side receiver 204 transmits a signal to a circuit 206 in the high side driver that, in turn, provides the high-side gate control signal HG to the gate electrode of the high side transistor 110. A low side receiver 208 receives the low-side signal LC and transmits a signal to a circuit 210 that, in turn, provides the low-side gate control signal LG to the gate electrode of the low side transistor 112. In one embodiment, the high side driver does not include the circuit 206. That is, the signal output from the receiver 204 is applied directly to the gate electrode of the high side transistor.

In operation, the high side transistor is turned on and the low side transistor is turned off to provide a high output voltage $V_{out}$ via the output node. On the other hand, the high side transistor is turned off and the low side transistor is turned on to provide a low output voltage $V_{out}$ via the output node.

A delay circuit may be provided in the low side driver 106, e.g., in the circuit 210, to ensure that the low side transistor 112 is not turned on while the high side transistor is turned on. That is, the delay circuit provides a dead time between the turn-on time of the high side transistor and the turn-on time of the low side transistor to prevent cross conduction. The delay circuit may use a plurality of inverters in series to obtain the desired signal delay, as explained in more detail in a patent application entitled, "Efficient Gate Driver IC for Power Devices," filed on Apr. 30, 2002, assigned to the present assignee, which is incorporated by reference herein for all purposes.

In one embodiment, a level shift circuit and related components described herein below are provided within a signal generator 208 that includes the transceiver 202 and the receiver 204. The signal generator 208 is distributed in the high and low side drivers 104 and 106 in the present embodiment. In other embodiments, the signal generator 208 is provided entirely in the high side driver.

Figure 3:
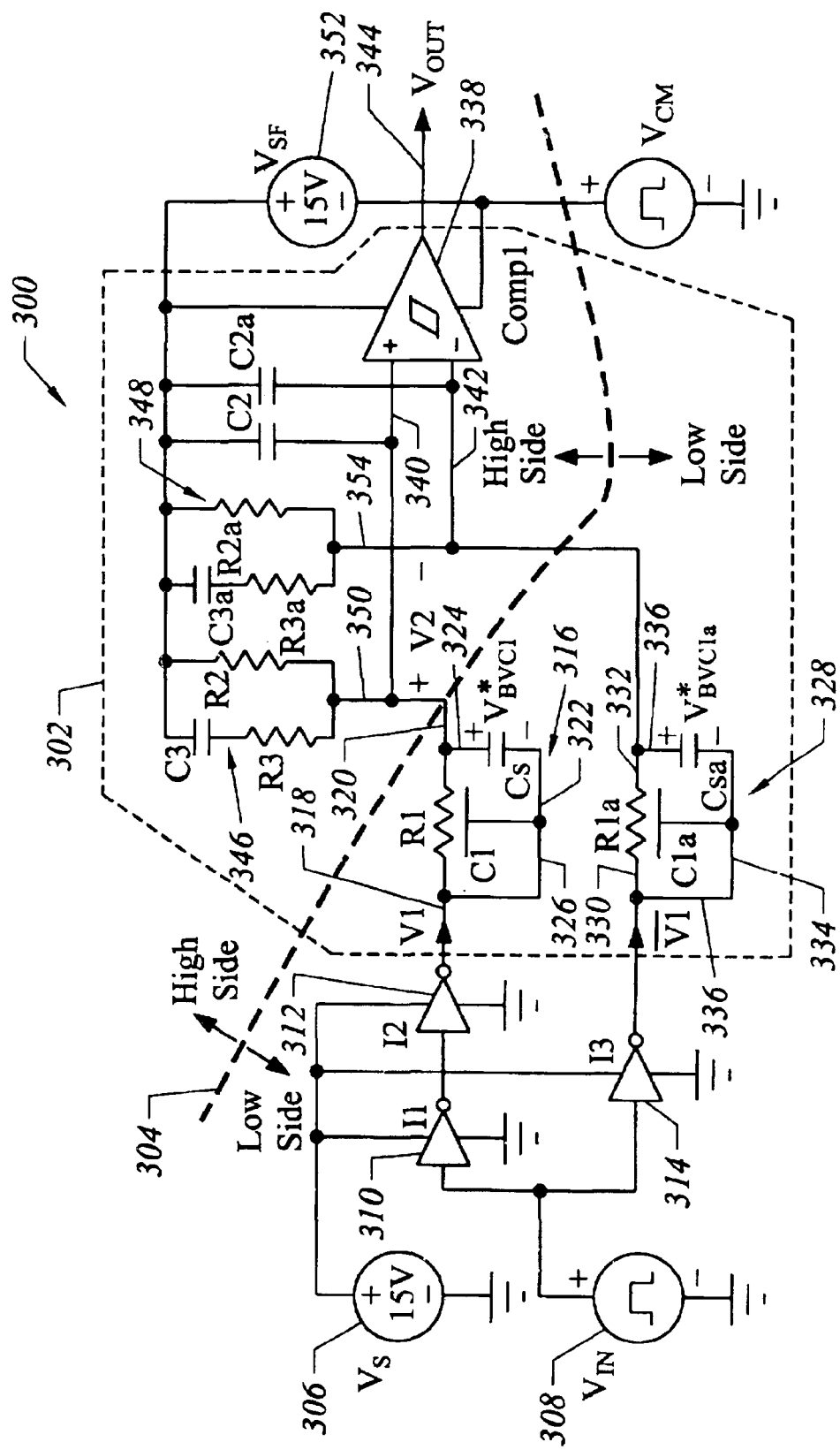
FIG. 3 illustrates a schematic circuit diagram of a signal generator having a level shift circuit according to one embodiment of the present invention.

FIG. 3 depicts a signal generator 300 including a resistive level shift circuit 302 according to one embodiment of the present invention. A dotted line 304 indicates whether varies components in the signal generator is provided in the high side driver or the low side driver. The placement of these components in the high side or low side driver is embodiment specific. For example, in the present embodiment, the level shift circuit 302 is distributed between the high and low side drivers. However, the level shift circuit may be provided entirely in the high side driver.

The signal generator 300 includes a first voltage source 306 and a pulse generator 308 that are coupled to a plurality of inverters 310, 312, and 314. The inverters are arranged serially into two different groups. The first group includes the inverters 310 and 312, and the second group includes the inverter 314. The inverters in the first and second groups are configured to output complementary signals to the level shift circuit 302. That is, the first group outputs a first signal V1, and the second group outputs a second signal V1' that is complementary to the signal V1.

A first sub-circuit 316 of the level shift circuit 302 receives the first signal V1. The first sub-circuit 316 includes a resistor R1, a capacitor C1, and a capacitor Cs. A first node 318 of the resistor R1 is coupled to the output of the first group of invertors. A second node 320 of the resistor R1 outputs a first voltage that is used to generate a gate control signal, as explained in more detail later. The capacitor C1 represents the resistor-to-substrate capacitance. On the other hand, the capacitor Cs represents the bond pad-to-substrate capacitance. A first node 322 (e.g., substrate) of the capacitor Cs is coupled to the first node 318 of the resistor R1, and the second node 324 (e.g. bond pad) of the capacitor Cs is coupled to the second node 320 of the resistor R1. As used herein, the term "substrate" includes a conductive layer, such as an N diffusion layer, formed on the substrate.

In one embodiment, the capacitor Cs is formed by providing a conductive layer below a bonding pad and on an upper surface of the semiconductor substrate, as explained in greater detail subsequently. The conductive layer is configured to extend below the resistor R1 and is electrically coupled to the first node of the resistor R1. Accordingly, the second node 324 of the capacitor Cs is commonly shared with the capacitor C1. That is, the capacitors C1 and Cs are provided with return points. A feed forward connection 326 provided by the capacitor Cs and its nodes 322 and 324 enhances the device performance by preventing a lag or pole (signal delay) from being introduced to the edges of a signal. Without the feed forward connection, i.e., the conductive layer, the capacitor C1 would represent a stray resistor-to-substrate capacitance that would degrade the device performance.

Similarly, a second sub-circuit 328 of the level shift circuit 302 receives the second, complementary signal V1'. The second sub-circuit 328 includes a resistor R1a, a capacitor C1a, and a capacitor Csa. A first node 330 of the resistor R1a is coupled to the output of the second inverter group. A second node 332 of the resistor R1a outputs a second voltage that is used to generate a gate control signal. The capacitor C1a represents the resistor-to-substrate capacitance. The capacitor Csa represents the pad metal-to-substrate capacitance. A first node 334 of the capacitor Csa is coupled to the first node 318 of the resistor R1a, and the second node 336 of the capacitor Csa is coupled to the second node 332 of the resistor R1a.

The capacitor Csa is formed by providing a conductive layer below a bonding pad and on an upper surface of the semiconductor substrate. The conductive layer is configured to extend below the resistor R1a and is electrically coupled to the first node of the resistor R1a. Accordingly, the second node of the capacitor Csa is commonly shared with the capacitor C1a. A feed forward connection 336 is provided by the capacitor Csa, and its nodes 332 and 334 enhance the device performance, as explained above.

The level shift circuit 302 includes a hysteresis comparator 338 (or gate control signal generator) having a first input 340, a second input 342, and an output 344. The first input is coupled to the node 320 of the resistor R1 that outputs a first voltage, and the second input is coupled to the node 332 of the resistor R1a that outputs a second voltage that is complementary of the first voltage. Capacitors C2 and C2a are associated with the first input 340 and the second input 342. A voltage difference V2 between the first voltage and the second voltage is used to drive the comparator and output a high-side gate control signal HG via the output node 344.

The level shift circuit 302 further includes a first capacitor-resistor network 346 and a second capacitor-resistor network 348. An input node 350 of the first capacitor-resistor network is coupled to the output of the first sub-circuit. The first capacitor-resistor includes a resistor R2, a resistor R3, and a capacitor C3. The resistors R2 and R3 are provided in a parallel configuration and coupled to the output of the first sub-circuit. The capacitor C3 is provided in series with the resistor R3 and coupled to a second voltage source 352. The voltage source 352 is also coupled to one end of the resistor R2.

Similarly, an input node 354 of the second capacitor-resistor network is coupled to the output of the second sub-circuit. The second capacitor-resistor network includes a resistor R2a, a resistor R3a, and a capacitor C3a. The resistors R2a and R3a are provided in a parallel configuration and coupled to the output of the second sub-circuit. The capacitor C3a is provided in series with the resistor R3a and coupled to the second voltage source 352. The voltage source 352 is also coupled to one end of the resistor R2a.

In one embodiment, the values of the capacitors C2, C2a, C3, C3a and the resisters R2, R2a, R3, and R3a are selectively provided to prevent voltage spikes that may be generated by the feed forward connections 326 and 328. The level shift circuit 302 has been provided with the following values to obtain attenuation of 50:1:

C2=50 pf
C2a=50 pf
C3=5 pf
C3a=5 pf
R2=20,000 ohms
R2a=20,000 ohms
R3=10,000 ohms
R3a=10,000 ohms If a greater attenuation ratio is desired, the values of the capacitors may be increased and the values of the resistors may be decreased. On the other hand, if a lower attenuation ratio is desired, the values of the capacitors may be decreased and the values of the resistors may be increased.

FIG. 4A illustrates a schematic, partially delayered, structural top view 400 of the first sub-circuit 316 of the level shift circuit 302 according to one embodiment of the present invention. The structure 400 depicts a conductive layer 402 provided on the upper surface of a substrate (not shown), a bond pad 404 overlying a portion of the conductive layer, the resistor R1, a wire 406 corresponding to the node 320 in FIG. 3 that is bonded to the bond pad 404, and a metallization layer 408 corresponding to the node 318 in FIG. 3. The resistor R1 is coupled to the wire 406 and the metallization layer 408 via contacts 410 and 412, respectively. A contact 414 electrically couples the metallization layer 408 and the conductive layer 402 to provide the feed forward connection 326 of FIG. 3. The conductive layer 402 is an N diffusion region in one embodiment. The conductive layer 402 extends below the resistor R1 and the bond pad 404 to provide the capacitors C1 and Cs.

FIG. 4B illustrates a schematic, cross-sectional view of the structure 400 taken along the arrows AA according to one embodiment of the present invention. The structure 400 depicts a substrate 416, the conductive layer 402, the bond pad 404, the wire 406, the metallization layer 408, the contacts 410, 412, and 414, and the resister R1. The structure 400 further includes a dielectric layer 418 provided over the conductive layer 402 to separate the conductive layer from the resistor R1 and the bond pad 404. The dielectric layer 418, accordingly, provides the capacitors C1 and Cs.

In one embodiment, the dielectric layer 418 is an oxide layer. The thickness of the oxide layer below the bond pad is about 10,000 angstroms, and the thickness of the oxide layer below the resistor R1 is about 6,000 angstroms. The breakdown voltage of the oxide layer is generally 70 volts/1000 angstroms. The breakdown voltage of the structure 400 or the level shift circuit 302, accordingly, is about 420 volts for the above design specification. Increasing the oxide layer thickness may raise the breakdown voltage.

Figure 5:
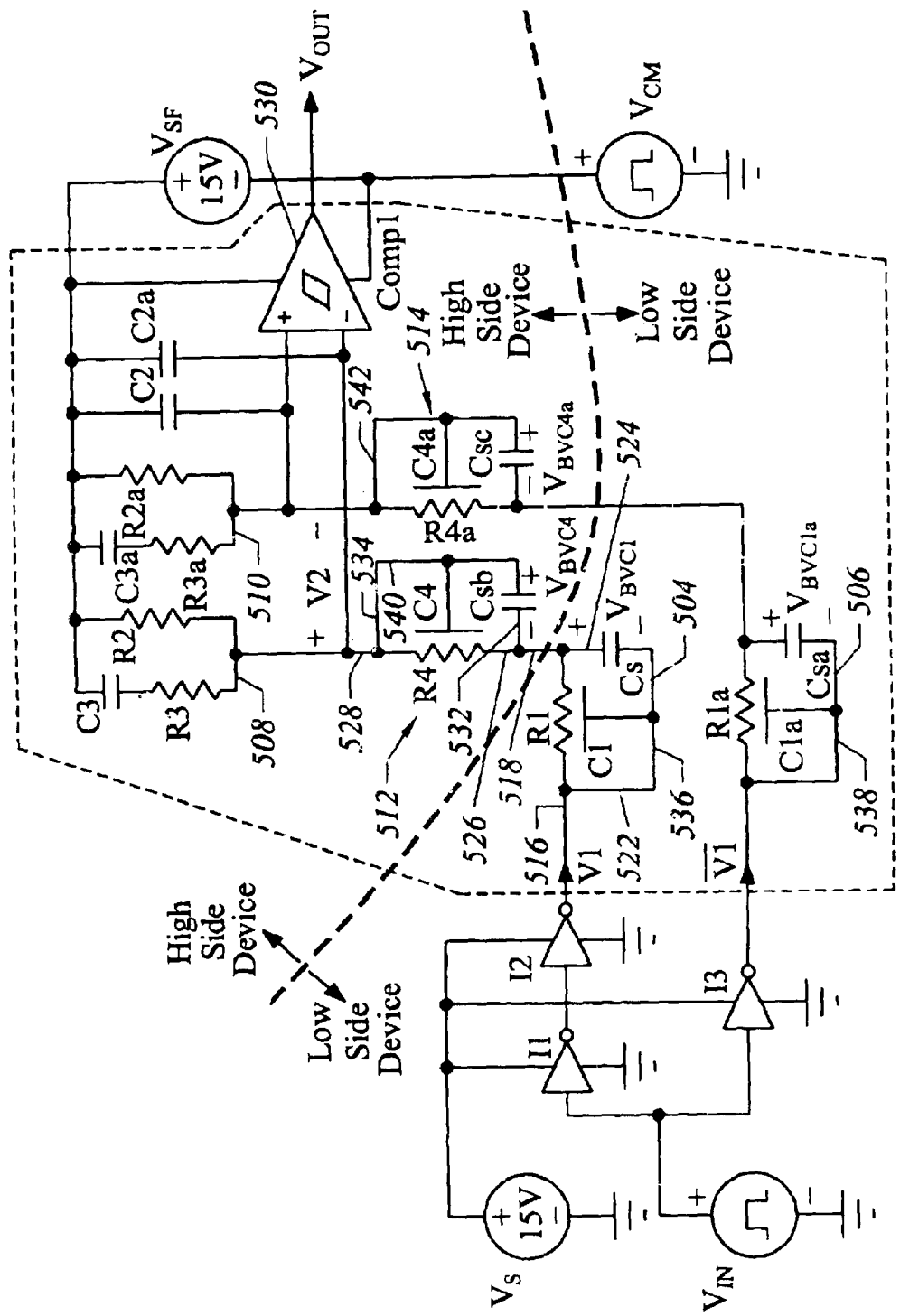
FIG. 5 illustrates a schematic circuit diagram of a signal generator having a level shift circuit with two sub-circuits in series according to one embodiment of the present invention.

FIG. 5 illustrates an alternative method of increasing the break down voltage according to one embodiment of the present invention. A signal generator 500 includes a level shift circuit 502 having a first sub-circuit 504, a second sub-circuit 506, a first capacitor-resistor network 508, a second capacitor-resistor network 510, a third sub-circuit 512, and a fourth sub-circuit 514. The first and second sub-circuits 504 and 506 correspond to the first and second sub-circuits 316 and 328 of the level shift circuit 302. The first and second capacitor-resistor network 508 and 510 correspond to the first and second capacitor-resistor network 346 and 348 of the level shift circuit 302.

The first sub-circuit 504 includes a resistor R1, a capacitor C1, and a capacitor Cs. A first node of the resistor R1 or input of the first sub-circuit 504 receives a voltage signal V1 from an output of a group of invertors. A second node 518 of the resistor R1 or output of the first sub-circuit 504 outputs a first voltage that is used subsequently to generate a gate control signal, as in the level shift circuit 302. The capacitor C1 represents the resistor-to-substrate capacitance. The capacitor Cs represents the bond pad-to-substrate capacitance. A first node 522 (e.g., substrate) of the capacitor Cs is coupled to the first node 516 of the resistor R1, and the second node 524 (e.g. bond pad) of the capacitor Cs is coupled to the second node 518 of the resistor R1. The second sub-circuit 506 has substantially the same configuration as the first sub-circuit 504.

The third and fourth sub-circuits 512 and 514 have similar configuration as the first and second sub-circuits 504 and 506. The third sub-circuit 512 includes a resistor R4, a capacitor C4, and a capacitor Csb. A first node 526 of the resistor R4 or input of the third sub-circuit 512 is coupled to the output of the first sub-circuit 504. A second node 528 of the resistor R4 or output of the third sub-circuit 512 is coupled to an input of a comparator 530. The capacitor C4 represents the resistor-to-substrate capacitance. The capacitor Csb represents the bond pad-to-substrate capacitance. A first node 532 (e.g. bond pad) of the capacitor Csb is coupled to the first node 526 of the resistor R4, and the second node 534 (e.g. substrate) of the capacitor Csb is coupled to the second node 528 of the resistor R4. The fourth sub-circuit 514 has substantially the same configuration as the third sub-circuit 512.

Accordingly, the third and fourth sub-circuits 512 and 514 are provided in series with the first and second sub-circuits 504 and 506, respectively. The first and second sub-circuits 504 and 506 have feed forward connections 536 and 538, respectively, to enhance device performance. The third and fourth sub-circuits 512 and 514 similarly have feed forward connections 540 and 542, respectively, to enhance device performance. In one embodiment, the first and second sub-circuits 504 and 506 are provided in the low side driver, and the third and fourth sub-circuits 512 and 514 are provided in high side driver.

As with the first sub-circuit 316, the first sub-circuit 504 of the level shift circuit 502 has a breakdown voltage of about 420 volts. In addition, the third sub-circuit 512 provided in series with the first sub-circuit has a breakdown voltage of about 420 volts. Accordingly, the level shift circuit 502 is provided with a breakdown voltage of about 840 volts. An additional sub-circuit may be provided in series with the first and third sub-circuits to provide a higher breakdown voltage.

FIG. 6A illustrates a schematic, partially delayered, structural top view 600 of the first sub-circuit 504 of the level shift circuit 502 and a schematic, partially delayered, structural top view 602 of the third sub-circuit 512 according to one embodiment of the present invention. The structure 600 and the structure 602 are provided in the low side driver and the high side driver, respectively.

The structure 600 depicts a conductive layer 606 provided on an upper surface of a substrate (not shown), a bond pad 608 overlying a portion of the conductive layer, the resistor R1, a wire 610 that is bonded to the bond pad 608, and a metallization layer 612. The resistor R1 is coupled to the wire 610 and the metallization layer 612 via contacts 614 and 616, respectively. A contact 616 electrically couples the metallization layer 612 and the conductive layer 606 to provide the feed forward connection 536. The conductive layer 606 extends below the resistor R1 and the bond pad 608 to provide the capacitors C1 and Cs. The conductive layer 606 is an N diffusion region in one embodiment.

The structure 602 depicts a conductive layer 618 provided on an upper surface of a substrate (not shown), a bond pad 620 overlying a portion of the conductive layer, the resistor R4, a wire 622 that is bonded to the bond pad 620, and a metallization layer 624. The wire 622 is coupled to the wire 610 of the structure 600. The resistor R4 is coupled to the wire 622 and the metallization layer 624 via contacts 626 and 628, respectively. A contact 630 electrically couples the metallization layer 624 and the conductive layer 618 to provide the feed forward connection 540. The conductive layer 618 extends below the resistor R4 and the bond pad 620 to provide the capacitors C4 and Csb.

FIG. 6B illustrates a schematic, cross-sectional view of the structures 600 and 602 taken along the arrows BB according to one embodiment of the present invention. The structure 600 depicts a substrate 632, the conductive layer 606, the bond pad 608, the wire 610, the metallization layer 612, the contacts 614, and 616, and the resistor R1. The structure 600 further includes a dielectric layer 634 provided over the conductive layer 606 to separate the conductive layer from the resistor R1 and the bond pad 608. The resistor R1, the bond pad 608, and the dielectric layer 634 together form the capacitors C1 and Cs.

Similarly, the structure 602 depicts the substrate 632, the conductive layer 618, the bond pad 620, the wire 622, the metallization layer 624, the contacts 626 and 628, and the resister R4. The structure 602 further includes a dielectric layer 636 provided over the conductive layer 618 to separate the conductive layer from the resistor R4 and the bond pad 620. The resistor R4, the bond pad 620, and the dielectric layer 636 together form the capacitors C4 and Csb.

In one embodiment, the dielectric layer 634 is an oxide layer. The thickness of the oxide layer below the bond pad is about 10,000 angstroms and below the resistor R1 is about 6,000 angstroms. The breakdown voltage of the oxide layer is generally 70 volts/1000 angstroms. The breakdown voltage of the structure 600, accordingly, is about 420 volts for the above design specification. Similarly, the dielectric layer 636 is an oxide layer having a thickness below the bond pad of about 10,000 angstroms and a thickness below the resistor R4 of about 6,000 angstroms. The breakdown voltage of the structure, accordingly, is about 420 volts for the above design specification. The structures 600 and 602 together provide the level shift circuit 502 with a breakdown voltage of 840 volts.

Figure 7A:
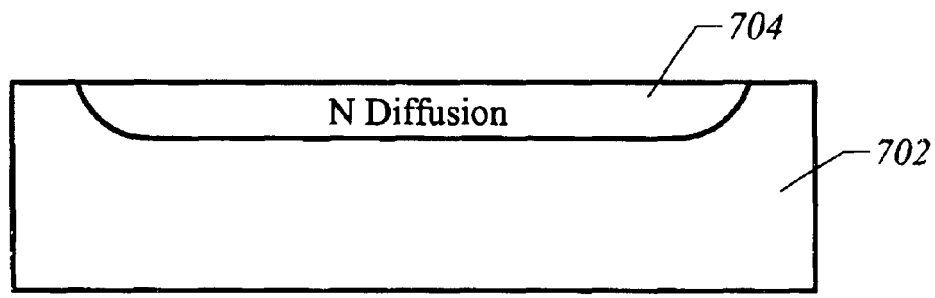
FIG. 7A illustrates a cross-sectional view of a partially fabricated substrate having a conductive region that extends from a metal layer to a bonding pad according to one embodiment of the present invention.

FIG. 7A illustrates a cross-sectional view of a substrate 702 that has been partially fabricated to provide thereon a circuit corresponding to the first sub-circuit 316 of FIG. 4B according to one embodiment of the present invention. The substrate 702 is a semiconductor, e.g., silicon substrate. A conductive region 704, e.g., N diffusion region, is formed on an upper surface of the substrate 702. In one embodiment, N type dopants are injected into the substrate using an ion implantation method. Thereafter, the dopants are diffused to form the conductive region 704.

Figure 7B:
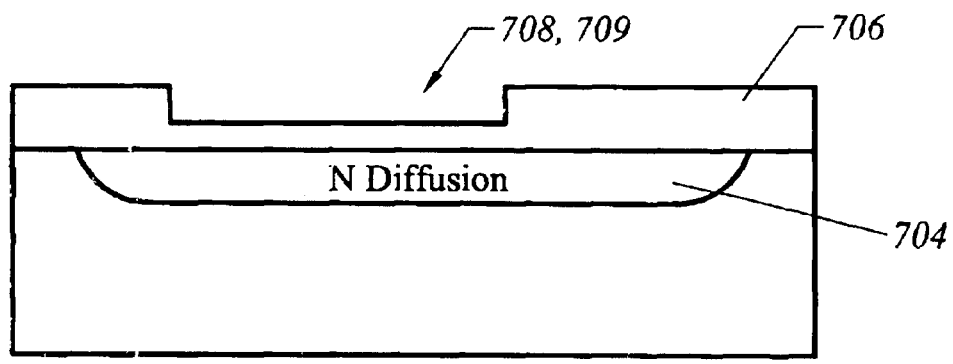
FIG. 7B illustrates a cross-sectional view of the substrate of FIG. 7A having a first dielectric layer and a trench according to one embodiment of the present invention.

A first dielectric layer 706, e.g., oxide layer, is formed overlying the conductive layer 704 to a first thickness (FIG. 7B). A first photoresist (not shown) is provided over the first dielectric layer 706 and patterned to expose an area 708. The exposed area 708 is etched to form a trench 709. The trench 709 overlies the conductive layer 706 without contacting the conductive layer, so that the these two regions are electrically isolated. The first photoresist is stripped from the substrate using a conventional technique.

Figure 7C:
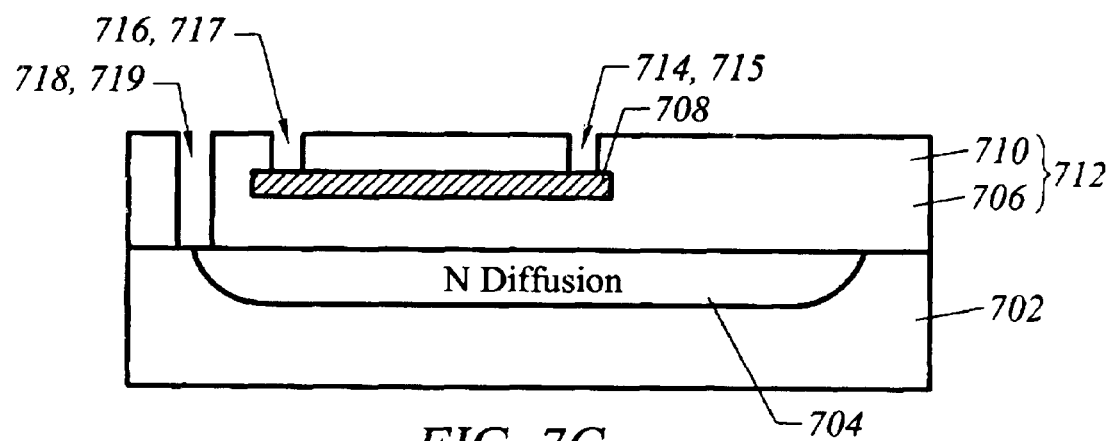
FIG. 7C illustrates a cross-sectional view of the substrate of FIG. 7B having a resistor formed overlying the conductive region according to one embodiment of the present invention.

A conductive layer 708, e.g., polysilicon, is deposited within the trench 709 (FIG. 7C). The conductive layer 708 is patterned to form a resistor corresponding to the resistor R1 of FIGS. 3 and 4A. Thereafter, a second dielectric layer 710, e.g., oxide layer, is formed over the patterned conductive layer and the first dielectric layer. A second photoresist (not shown) is provided over the second dielectric layer and patterned to expose portions 714, 716, and 718 of the second dielectric layer. The exposed portions are etched to form a plurality of trenches 715, 717, and 719. The second photoresist is stripped away using a conventional technique. The trenches 715, 717, and 719 are filled with conductive material to form a plurality of plugs corresponding to the contacts 410, 412, and 414 of FIG. 4A. Thereafter, the fabrication process continues to provide the substrate 702 with a bonding pad and wiring, as shown in FIG. 4A. The plug formed within the trench 719 that is electrically coupled to the conductive region 704 and the conductive region 704 provided below the bonding pad to form a capacitor Cs together provide a feed forward connection to enhance device performance according to one embodiment of the present invention.

The above detailed descriptions are provided to illustrate specific embodiments of the present invention and are not intended to be limiting. Numerous modifications and variations within the scope of the present invention are possible. Accordingly, the present invention is defined by the appended claims.

What is claimed is:

1. A power module, comprising:
  a power semiconductor device having a first terminal, a second terminal, and a third terminal, the second terminal being a control terminal to regulate flow of electricity between the first and third terminals; and
  a gate driver having an output node coupled to the second terminal of the power device to provide gate control signals to the power semiconductor device, the gate driver including:
    a gate control signal generator having a first input and a second input,
    a first sub-circuit having a first signal path and a second signal path that are suitable for transmitting signals, the first and second signal paths coupled to the first input of the gate control signal generator, the second signal path being configured to provide a signal to the first input with a reduced signal delay, and
    a second sub-circuit coupled to the second input of the gate control signal generator.

2. The power module of claim 1, wherein the first signal path of the first sub-circuit includes a first resistor with a first end configured to receive an input signal and a second end configured to output a signal of first voltage to the first input of the signal generator, and the second signal path including a first capacitor having a first end and a second end, the first end of the first capacitor being electrically coupled to the first end of the first resistor and the second end of the first capacitor being electrically coupled to the second end of the first resistor.

3. The power module of claim 2, wherein the second sub-circuit includes a third signal path and a fourth signal path that are suitable for transmitting signals, the third and fourth signal paths coupled to the second input of the gate control signal generator.

4. The power module of claim 3, wherein the third signal path of the second sub-circuit includes a second resistor with a first end configured to receive an input signal and a second end configured to output a signal of second voltage to the second input of the signal generator, and the fourth signal path including a second capacitor having a first end and a second end, the first end of the second capacitor being electrically coupled to the first end of the second resistor and the second end of the second capacitor being electrically coupled to the second end of the second resistor.

5. The power module of claim 4, wherein the gate control signal generator is configured to output a gate control signal according to a voltage difference between the signal of first voltage and the signal of second voltage.

6. The power module of claim 5, wherein the gate control signal generator is a hysteresis comparator.

7. The power module of claim 1, wherein the second sub-circuit has a third signal path and a fourth signal path that are suitable for transmitting signals, the third and fourth signal paths coupled to the second input of the gate control signal generator, the fourth signal path being configured to provide a signal to the second input with a reduced signal delay.

8. A gate driver, comprising:
  a gate control signal generator having a first input and configured to output a gate control signal to a power semiconductor switch; and
  a first sub-circuit having a first signal path and a second signal path that are suitable for transmitting signals, the first and second signal paths coupled to the first input of the gate control signal generator, the second signal path being configured to provide a signal to the first input with a reduced signal delay.

9. The gate driver of claim 8, further comprising:
  a second sub-circuit coupled to a second input of the gate control signal generator, wherein the first input of the gate control signal generator receives a signal of first voltage from the first sub-circuit and the second input of the gate control signal generator receives a signal of second voltage from the second sub-circuit, wherein the gate control signal generator outputs a gate control signal according to a voltage difference between the signal of first voltage and the signal of second voltage.

10. The gate driver of claim 9, wherein the second sub-circuit includes a third signal path and a fourth signal path that are suitable for transmitting signals, the third and fourth signal paths coupled to the second input of the gate control signal generator.

11. The gate driver of claim 10, wherein the second signal path and fourth signal path are feed forward connections.

12. The gate driver of claim 8, wherein the first signal path of the first sub-circuit includes a first resistor with a first end configured to receive an input signal and a second end configured to output a signal of first voltage to the first input of the signal generator, and the second signal path including a first capacitor having a first end and a second end, the first end of the first capacitor being electrically coupled to the first end of the first resistor and the second end of the first capacitor being electrically coupled to the second end of the first resistor.

13. The gate driver of claim 12, further comprising:
  a second sub-circuit including a third signal path and a fourth signal path that are suitable for transmitting signals, the third and fourth signal paths coupled to a second input of the gate control signal generator.

14. The gate driver of claim 13, wherein the third signal path of the second sub-circuit includes a second resistor with a first end configured to receive an input signal and a second end configured to output a signal of second voltage to the second input of the signal generator, and the fourth signal path including a second capacitor having a first end and a second end, the first end of the second capacitor being electrically coupled to the first end of the second resistor and the second end of the second capacitor being electrically coupled to the second end of the second resistor.

15. The gate driver of claim 8, further comprising:
  a second sub-circuit having a third signal path and a fourth signal path that are suitable for transmitting signals, the third and fourth signal paths coupled to the second input of the gate control signal generator, the fourth signal path being configured to provide a signal to the second input with a reduced signal delay;
  a third sub-circuit provided in series between the first sub-circuit and the first input of the gate control signal generator, the third sub-circuit including a fifth signal path and a sixth signal path coupled to the first input of the gate control signal generator; and
  a fourth sub-circuit provided in series between the second sub-circuit and the second input of the gate control signal generator, the fourth sub-circuit including a seventh signal path and a eighth signal path coupled to the second input of the gate control signal generator.

16. The gate driver of claim 15, wherein the third and fourth sub-circuits provide the gate driver with an increased breakdown voltage.

17. A power device, comprising:

a gate control signal generator having a first input and configured to output a gate control signal to a power semiconductor switch;

a first sub-circuit having a first signal path and a second signal path that are suitable for transmitting signals, the first and second signal paths coupled to the first input of the gate control signal generator, the second signal path being configured to provide a signal to the first input with a reduced signal delay; and a second sub-circuit includes a third signal path and a fourth signal path that are suitable for transmitting signals, the third and fourth signal paths coupled to the second input of the gate control signal generator, wherein the first input of the gate control signal generator receives a signal of first voltage from the first sub-circuit and the second input of the gate control signal generator receives a signal of second voltage from the second sub-circuit, wherein the gate control signal generator outputs a gate control signal according to a voltage difference between the signal of first voltage and the signal of second voltage, wherein the second signal path and fourth signal path are feed forward connections.

18. The gate driver of claim 17, wherein the first signal path of the first sub-circuit includes a first resistor with a first end configured to receive an input signal and a second end configured to output a signal of first voltage to the first input of the signal generator, and the second signal path including a first capacitor having a first end and a second end, the first end of the first capacitor being electrically coupled to the first end of the first resistor and the second end of the first capacitor being electrically coupled to the second end of the first resistor.

19. The gate driver of claim 17, wherein the third signal path of the second sub-circuit includes a second resistor with a first end configured to receive an input signal and a second end configured to output a signal of second voltage to the second input of the signal generator, and the fourth signal path including a second capacitor having a first end and a second end, the first end of the second capacitor being electrically coupled to the first end of the second resistor and the second end of the second capacitor being electrically coupled to the second end of the second resistor.

20. The gate driver of claim 17, further comprising:

a third sub-circuit provided in series between the first sub-circuit and the first input of the gate control signal generator, the third sub-circuit including a fifth signal path and a sixth signal path coupled to the first input of the gate control signal generator; and a fourth sub-circuit provided in series between the second sub-circuit and the second input of the gate control signal generator, the fourth sub-circuit including a seventh signal path and a eighth signal path coupled to the second input of the gate control signal generator, wherein the third and fourth sub-circuits provide the gate driver with an increased breakdown voltage.

* * * * *